United States Patent
Yates et al.

(10) Patent No.: US 7,375,388 B2
(45) Date of Patent: May 20, 2008

(54) DEVICE HAVING IMPROVED SURFACE PLANARITY PRIOR TO MRAM BIT MATERIAL DEPOSITION

(75) Inventors: Donald L. Yates, Boise, ID (US); Joel A. Drewes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 29 days.

(21) Appl. No.: 10/734,201

(22) Filed: Dec. 15, 2003

(65) Prior Publication Data
US 2004/0124485 A1    Jul. 1, 2004

Related U.S. Application Data

(62) Division of application No. 10/022,721, filed on Dec. 20, 2001, now Pat. No. 6,743,641.

(51) Int. Cl.
*H01L 29/76* (2006.01)
(52) U.S. Cl. .................. 257/295; 257/421; 257/422; 257/E21.665
(58) Field of Classification Search ........ 257/295–311, 257/421–422, 427, E21.665
See application file for complete search history.

(56) References Cited

U.S. PATENT DOCUMENTS

| 5,354,712 | A | 10/1994 | Ho et al. |
| 5,940,319 | A * | 8/1999 | Durlam et al. ............. 365/171 |
| 6,110,648 | A | 8/2000 | Jang |
| 6,174,737 | B1 | 1/2001 | Durlam et al. |
| 6,181,013 | B1 | 1/2001 | Liu et al. |
| 6,211,090 | B1 * | 4/2001 | Durlam et al. ............. 438/692 |
| 6,555,858 | B1 * | 4/2003 | Jones et al. ................ 257/295 |
| 6,709,874 | B2 * | 3/2004 | Ning ............................ 438/3 |
| 2002/0098705 | A1 | 7/2002 | Low |

* cited by examiner

*Primary Examiner*—H. Jey Tsai
(74) *Attorney, Agent, or Firm*—Dickstein Shapiro LLP

(57) ABSTRACT

The present invention provides a method of fabricating a portion of a memory cell, the method comprising providing a first conductor in a trench which is provided in an insulating layer and flattening an upper surface of the insulating layer and the first conductor, forming a material layer over the flattened upper surface of the insulating layer and the first conductor and flattening an upper portion of the material layer while leaving intact a lower portion of the material layer over the insulating layer and the first conductor.

14 Claims, 13 Drawing Sheets

DEVICE HAVING IMPROVED SURFACE PLANARITY PRIOR TO MRAM BIT MATERIAL DEPOSITION

This application is a divisional of application Ser. No. 10/022,721, filed on Dec. 20, 2001, now U.S. Pat. No. 6,743,641 which is incorporated herein by reference.

FIELD OF INVENTION

The present invention relates to a magnetic random access memory (MRAM) and a fabricating method thereof, and more particularly to a method of improving surface planarity prior to bit material deposition.

BACKGROUND OF THE INVENTION

Magnetic random access memories (MRAMs) employ magnetic multilayer films as storage elements. When in use, an MRAM cell stores information as digital bits, which in turn depend on the alternative states of magnetization of thin magnetic multilayer films forming each memory cell. As such, the MRAM cell has two stable magnetic configurations, high resistance representing a logic state 0 and low resistance representing a logic state 1, or vice versa.

A typical multilayer-film MRAM includes a number of bit or digit lines intersected by a number of word lines. At each intersection, a film of a magnetically coercive material is interposed between the corresponding bit line and word line. Thus, this magnetic material and the multilayer films from the digit lines form a magnetic memory cell which stores a bit of information.

The basic memory element of an MRAM is a patterned structure of a multilayer material, which is typically composed of a stack of different materials, such as copper (Cu), tantalum (Ta), permalloy (NiFe) or aluminum oxide ($Al_2O_3$), among others. The stack may contain as many as ten different overlapping material layers and the layer sequence may repeat up to ten times. Fabrication of such stacks requires deposition of the thin materials layer by layer, according to a predefined order.

FIG. 1 shows an exemplary conventional MRAM structure including MRAM stacks 22 which have three respective associated bit or digit lines 18. The digit lines 18, typically formed of copper (Cu), are first formed in an insulating layer 16 formed over underlayers 14 of an integrated circuit (IC) substrate 10. Underlayers 14 may include, for example, portions of integrated circuitry, such as CMOS circuitry. A pinned layer 20, typically formed of ferromagnetic materials, is provided over each digit line 18. A pinned layer is called "pinned" because its magnetization direction does not change during operation of the memory device. A sense layer 21 is provided over each associated pinned layer 20. The MRAM stacks 22 are coupled to a word line 23 that intersects three pinned layers 20 and associated sense layers 21. The word line 23 and bit line 18 may also be interchanged.

An MRAM device integrates magnetic memory elements and other circuits, for example, a control circuit for magnetic memory elements, comparators for detecting states in a magnetic memory element, input/output circuits, etc. These circuits are fabricated in the process of CMOS technology in order to lower the power consumption of the MRAM device. The CMOS process requires high temperature steps which exceeds 300° C. for depositing dielectric and metal layers and annealing implants, for example.

In addition, a magnetic memory element includes very thin layers, some of them are tens of angstroms thick. The performance of the magnetic memory element is sensitive to the surface conditions on which magnetic layers are deposited. Accordingly, it is necessary to form a flat surface at certain stages of fabrication to prevent the characteristics of an MRAM device from degrading. The present invention provides a method of fabricating an MRAM having a more planar surface prior to deposition of the magnetic stack.

SUMMARY OF THE INVENTION

The present invention provides a method of improving surface planarity prior to bit material deposition in MRAM structures. In an exemplary embodiment of the invention, a first conductor in a trench is provided in an insulating layer and an upper surface of the insulating layer and the first conductor is planarized. This leaves a roughened upper surface on the conductor. Further, a material layer is formed over the planarized upper surface of the insulating layer and the first conductor and an upper portion of the material layer is again planarized or flattened while leaving intact a lower portion of the material layer over the insulating layer and the first conductor.

BRIEF DESCRIPTION OF THE DRAWINGS

The above advantages and features of the invention will be more clearly understood from the following detailed description which is provided in connection with the accompanying drawings.

DETAILED DESCRIPTION OF THE INVENTION

In the following detailed description, reference is made to various exemplary embodiments of the invention. These embodiments are described with sufficient detail to enable those skilled in the art to practice the invention, and it is to be understood that other embodiments may be employed, and that structural and electrical changes may be made without departing from the spirit or scope of the present invention.

The term "substrate" used in the following description may include any semiconductor-based structure that has an exposed semiconductor surface. Structure must be understood to include silicon, silicon-on insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could be silicon-germanium, germanium, or gallium arsenide. When reference is made to substrate in the following description, previous process steps may have been utilized to form regions or junctions in or on the base semiconductor or foundation.

The term "metal" is intended to include not only elemental metal, but metal with other trace metals or in various alloyed combinations with other metals as known in the semiconductor art. The term "metal" is also intended to include conductive oxides of such metals, as well as doped semiconductors and their respective conductive oxides.

Figure 1:
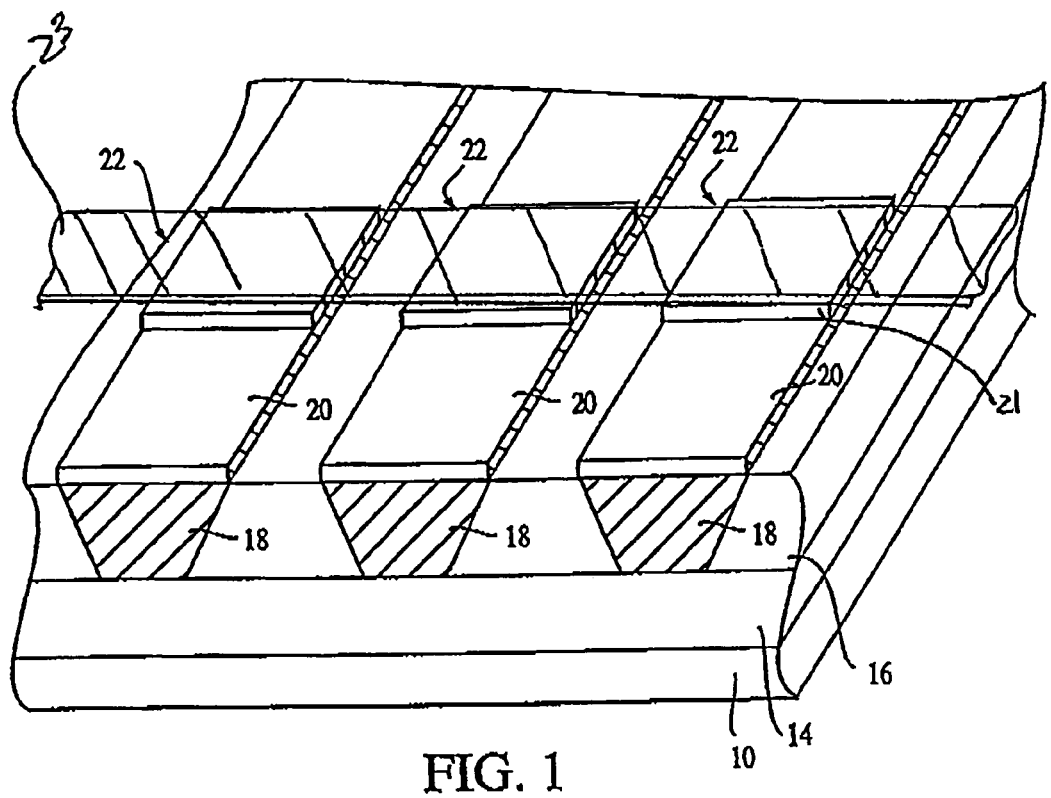
FIG. 1 is a schematic three-dimensional view of a portion of a conventional MRAM structure.
Figure 2:
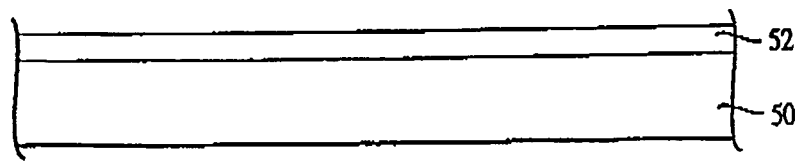
FIG. 2 illustrates a partial cross-sectional view of a semiconductor topography, at an intermediate stage of the processing, wherein a MRAM will be constructed in accordance with the present invention.

Referring now to the drawings, where like elements are designated by like reference numerals, FIGS. 2-21 illustrate an exemplary embodiment of a method of forming MRAM structures. FIG. 2 depicts a portion of a semiconductor substrate 50 on which underlying layer 52 has been already formed according to well-known methods of the prior art. The underlying layer 52 could include, for example, circuit layers forming CMOS devices and circuits.

Figure 3:
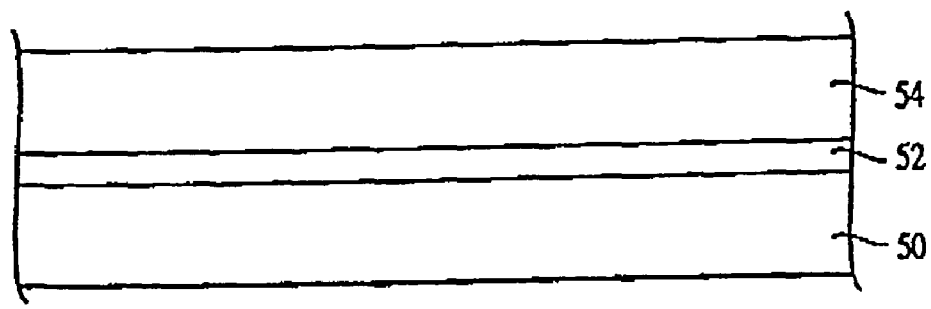
FIG. 3 illustrates a partial cross-sectional view of the MRAM of the present invention at a stage of processing subsequent to that shown in FIG. 2.

Referring now to FIG. 3, an insulating layer 54 is formed over the substrate 50 and the underlying layer 52. In an exemplary embodiment of the invention, the insulating layer 54 is blanket deposited by spin coating to a thickness of about 1,000 Angstroms to about 10,000 Angstroms. However, other known deposition methods, such as sputtering by chemical vapor deposition (CVD), plasma enhanced CVD (PECVD), or physical vapor deposition (PVD), may be used also in accordance with the characteristics of the IC device already formed. The insulating layer 54 may be formed of a conventional insulator, for example, BPSG, a thermal oxide of silicon, such as SiO or $SiO_2$, or a nitride such as $Si_3N_4$. Alternatively, a high temperature polymer, such as a polyimide, or a low dielectric constant inorganic material may also be employed.

Figure 4:
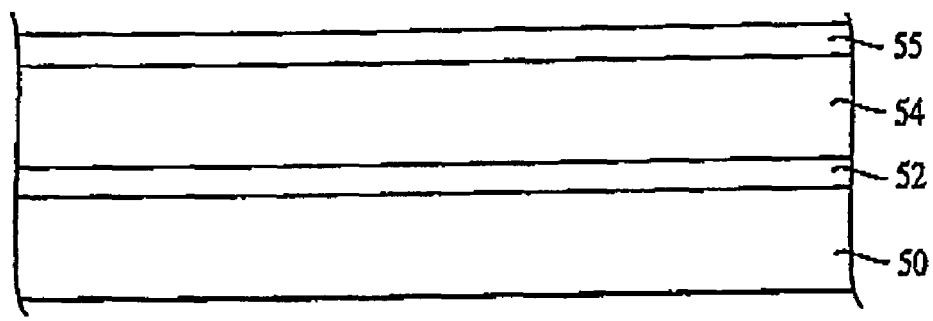
FIG. 4 illustrates a partial cross-sectional view of the MRAM of the present invention at a stage of processing subsequent to that shown in FIG. 3.

Next, as illustrated in FIG. 4, a photoresist layer 55 is formed over the insulating layer 54. The photoresist layer 55 is exposed through a mask 56 (FIG. 5) with high-intensity UV light. The mask 56 may include any suitable pattern of opaque and clear regions that may depend, for example, on the desired pattern to be formed in the insulating layer 54. This way, portions 55a of the photoresist layer 55 are exposed through portions 56a of the mask 56 wherever portions of the insulating layer 54 need to be removed.

Figure 5:
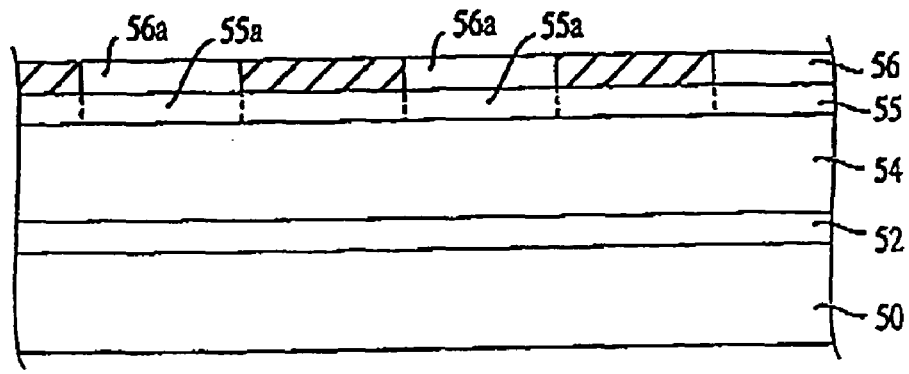
FIG. 5 illustrates a partial cross-sectional view of the MRAM of the present invention at a stage of processing subsequent to that shown in FIG. 4.
Figure 6:
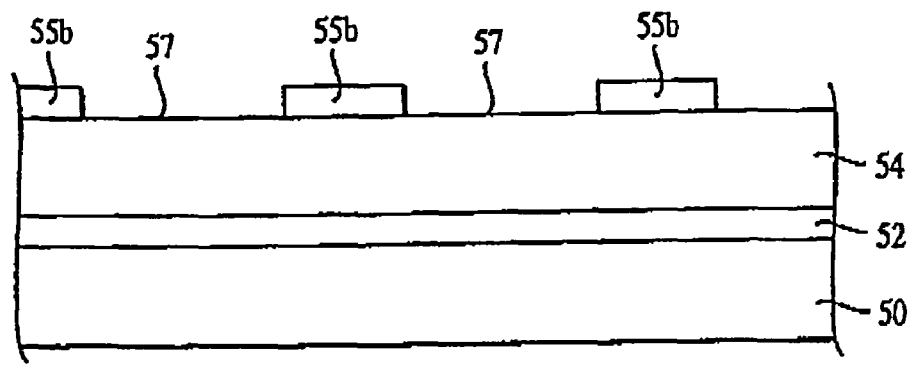
FIG. 6 illustrates a partial cross-sectional view of the MRAM of the present invention at a stage of processing subsequent to that shown in FIG. 5.

Although FIG. 5 schematically illustrates mask 56 positioned over the photoresist layer 55, those skilled in the art will appreciate that mask 56 is typically spaced from the photoresist layer 55 and light passing through mask 56 is focussed onto the photoresist layer 55. After exposure and development of the exposed portions 55a, portions 55b of the unexposed and undeveloped photoresist are left over the insulating-layer 54, as-shown in FIG. 6. This way, openings 57 (FIG. 6) are formed in the photoresist layer 55.

Figure 7:
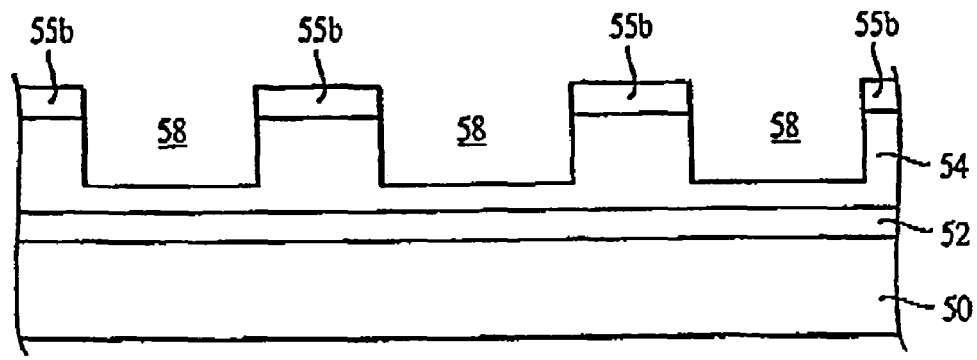
FIG. 7 illustrates a partial cross-sectional view of the MRAM of the present invention at a stage of processing subsequent to that shown in FIG. 6.
Figure 8:
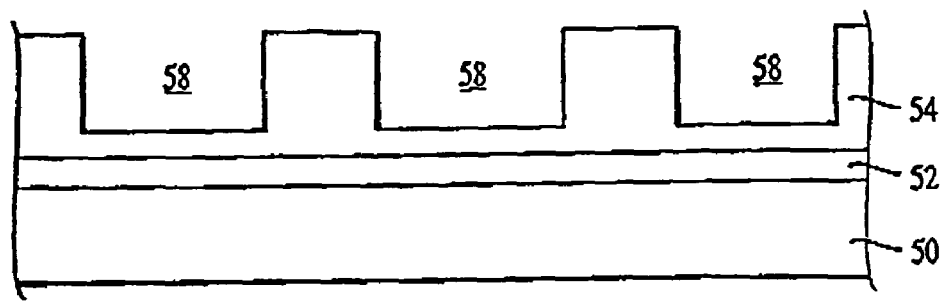
FIG. 8 illustrates a partial cross-sectional view of the MRAM of the present invention at a stage of processing subsequent to that shown in FIG. 7.

An etch step is next performed to obtain grooves 58 in the insulating layer 54, as illustrated in FIGS. 7-8. The grooves 58 are etched to a depth of about 500 Angstroms to about 2,000 Angstroms, more preferably of about 1,000 Angstroms. Subsequent to the formation of the grooves 58, the remaining portions 55b of the positive photoresist layer 55 are then removed by chemicals, such as hot acetone or methylethylketone, or by flooding the substrate 50 with UV irradiation to degrade the remaining portions 55b to obtain the structure of FIG. 8.

Figure 9:
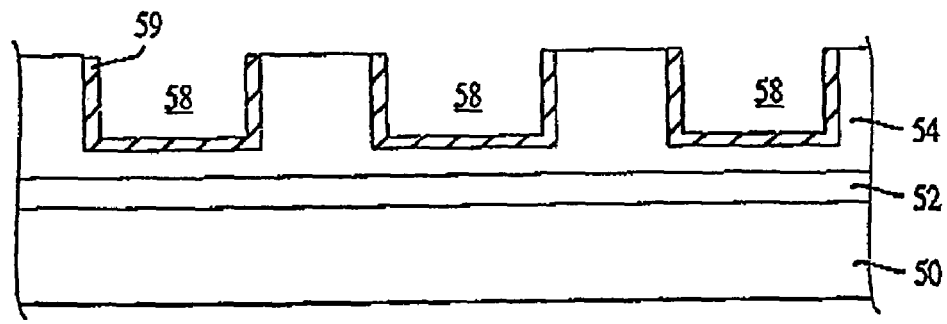
FIG. 9 illustrates a partial cross-sectional view of the MRAM of the present invention at a stage of processing subsequent to that shown in FIG. 8.

Subsequent to the formation of the grooves 58 (FIGS. 7-8), a thin barrier layer 59 is formed in the grooves 58 and over the insulating layer 54, and then chemical mechanical polished to remove barrier layer material from the top portions of the insulating layer 54, as shown in FIG. 9. The barrier layer 59 may comprise bonding materials such as tantalum (Ta), titanium (Ti), titanium-tungsten (TiW), titanium nitride (TiN) or chromium (Cr), among others. The barrier layer 59 forms a strong mechanical and chemical bond between the conductive material which will be formed later and the insulating layer 54 to help prevent peeling of the formed conductive layer from the insulating layer. In a preferred embodiment of the invention, the barrier layer 59 is formed of sputtered tantalum. In this embodiment, tantalum is deposited to a thickness of about 5 nm to about 10 nm. This layer may also be comprised of a ferromagnetic material deposited on the barrier or in place of the barrier for the purpose of field focusing.

Figure 10:
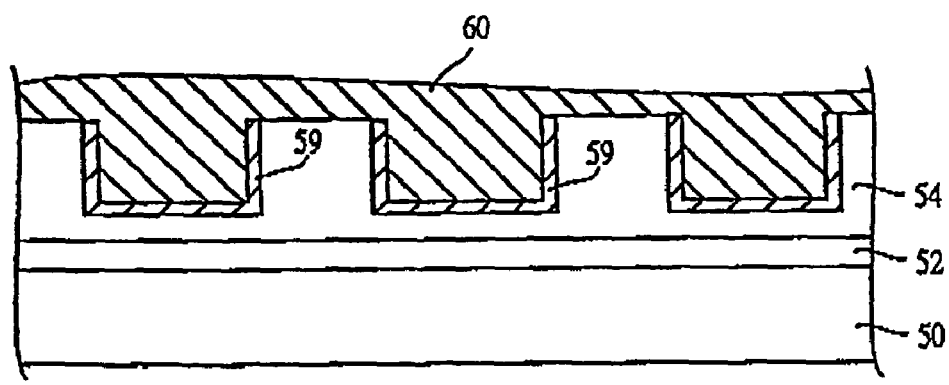
FIG. 10 illustrates a partial cross-sectional view of the MRAM of the present invention at a stage of processing subsequent to that shown in FIG. 9.

Next, as illustrated in FIG. 10, a conductive material layer 60 is formed over the barrier layer 59 and the insulating layer 54 to fill in the grooves 58. In a preferred embodiment, the conductive material comprises copper (Cu). However, other conductive materials such as aluminum, tungsten or gold, among others, may be used also. Further, metal alloys may be employed also, depending on desired characteristics of the IC device.

Figure 11:
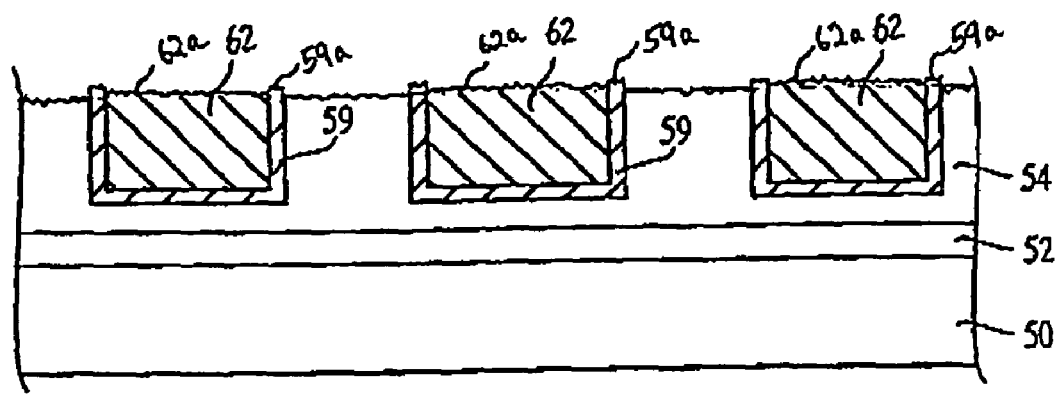
FIG. 11 illustrates a partial cross-sectional view of the MRAM of the present invention at a stage of processing subsequent to that shown in FIG. 10.

The conductive material layer 60 is formed over the barrier layer 59 by deposition, for example, and then excess material is removed to form metal lines 62 (FIG. 11). In an exemplary embodiment of the present invention, the excess conductive material layer 60 is removed by means of chemical mechanical polishing (CMP). The top surfaces of the barrier layer 59 and the metal lines 62 are generally flat and uniform across the entire surface of the substrate, as shown in FIG. 11. Each metal line 62 will form the bit or digit line of a conventional MRAM structure.

However, after the CMP polishing process, the top surfaces of the metal line 62 and barrier layer 52 as well as insulating layer 54, although generally flat, may still have unwanted, unflat topography as shown by the roughened portions 62a of metal line 62 and the protruding portion 59a of barrier layer 59. This is caused by slight variations in CMP selectivity to insulating layer 54, metal line 62 and barrier layer 59. Such unwanted topography can negatively affect performance of MRAM structures 100.

Figure 12:
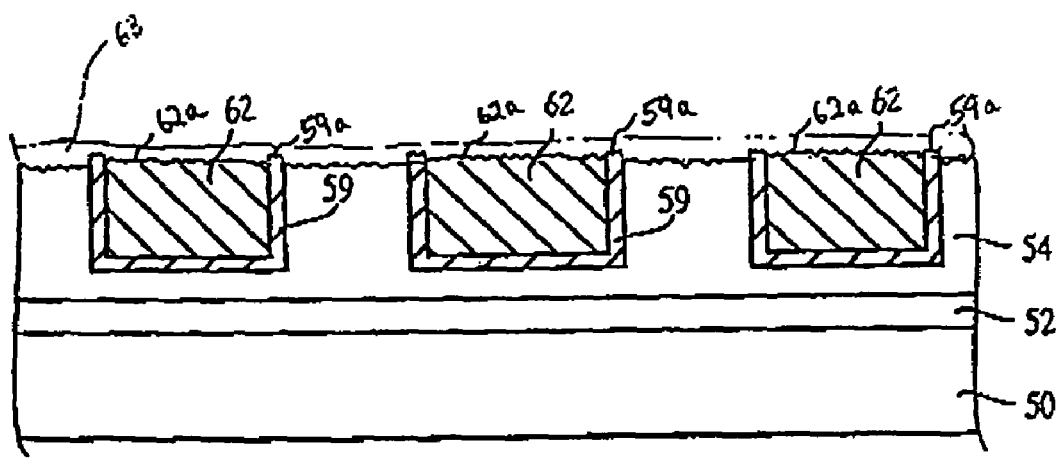
FIG. 12 illustrates a partial cross-sectional view of the MRAM of the present invention at a stage of processing subsequent to that shown in FIG. 11.

Hence, in an exemplary embodiment of the present invention as shown in FIG. 12, a second conductor layer or material layer 63 is formed over the upper surface of barrier layer 59, metal line 62 and insulating layer 54. Consequently, roughened portions 62a and protruding portions 59a are conformally covered by the second conductor layer 63. The second conductor layer 63 may comprise bonding materials such as tantalum (Ta), titanium (Ti), titanium-tungsten (TiW), titanium nitride (TiN) or chromium (Cr), among others. In a preferred embodiment of the invention, the conductor layer 63 is formed of sputtered tantalum. In this embodiment, tantalum is deposited to a thickness of about 5 nm to about 50 nm. In addition, this layer may be used as a series resistor by including a resistive material such as TaN, WSiN or other materials. The resistor layer can be deposited under the metal layer to be smoothed in order to preserve its thickness or in place of the conductor layer 63.

Figure 13:
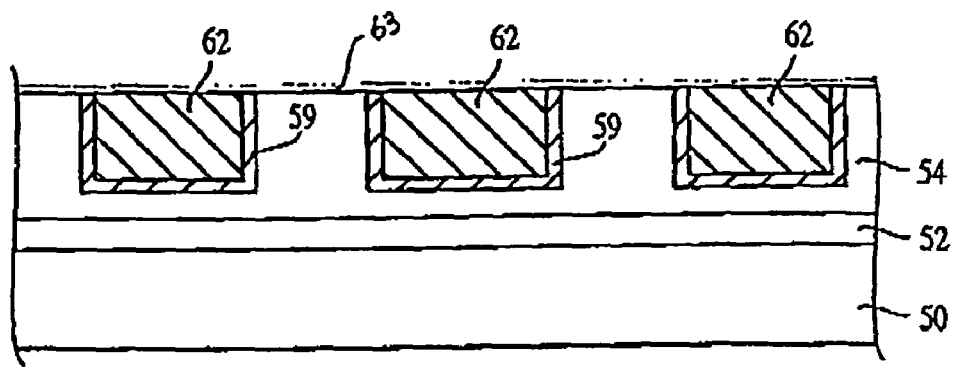
FIG. 13 illustrates a partial cross-sectional view of the MRAM of the present invention at a stage of processing subsequent to that shown in FIG. 12.

Next, as shown in FIG. 13, second conductor layer 63 is lightly polished to provide a planar surface for the subsequent fabrication of MRAM structures 100 (as described below). The term "lightly polished" is defined herein as polishing enough to planarize or flatten the second conductor layer 63 but not enough to pattern define. In other words, a top portion of the second conductor layer 63 is planarized and a lower portion of the second conductor layer 63 remains intact, conformally covering roughened portions 62a and protruding portions 59a. The portions of conductor layer 63 overlying insulating layer 54 are etched in subsequent steps (i.e., defining of the magnetic stack). Note, although roughened portions 62a and protruding portions 59a are not shown, they are still present in the intermediate structure of FIG. 13. However, as noted above, they are covered by the planarized second conductor layer 63 and have been omitted from FIG. 13 for simplicity. Further, in the proceeding Figures, conductor layer 63 is shown as simply the interface for the MRAM structure 100 and the metal line 62/barrier layer 59.

Figure 18:
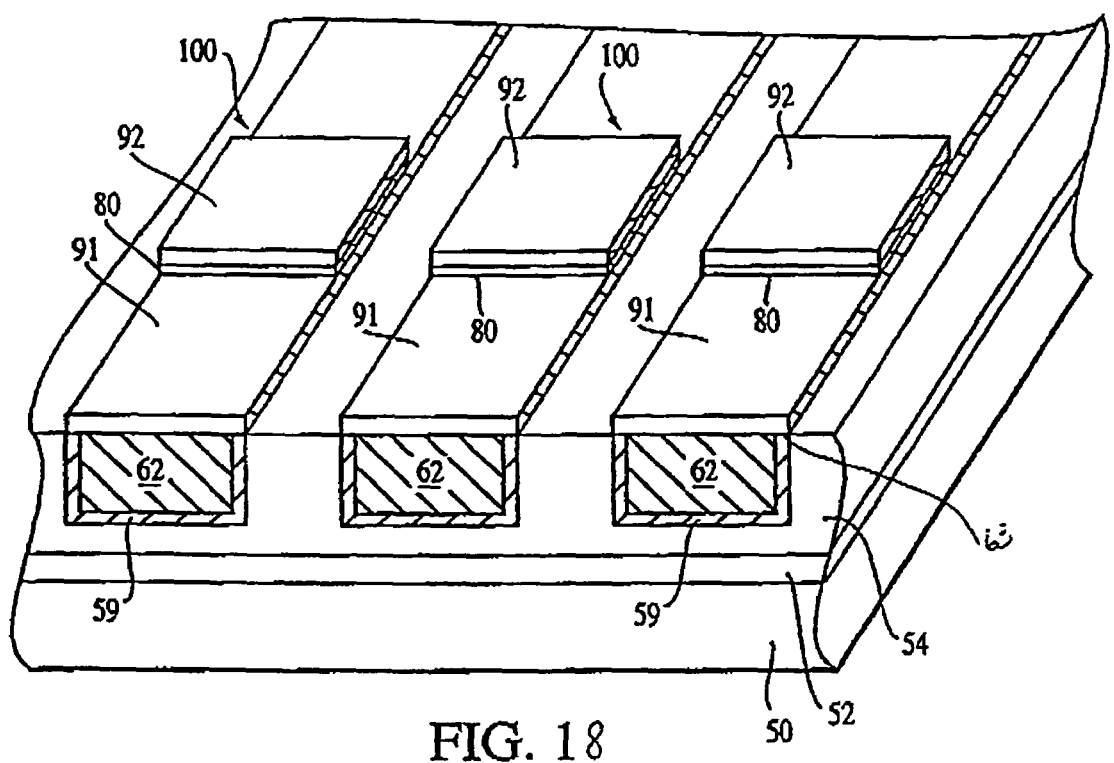
FIG. 18 is a partial three-dimensional view of the MRAM of FIG. 17 at a stage of processing subsequent to that shown in FIG. 17.

Next, the processing steps for the completion of the MRAM structures 100 are now carried out. As such, a plurality of magnetic multilayer films constituting a first magnetic member 79 are first formed over the metal lines 62, which will be later patterned into pinned layers 91 (FIG. 18). The first magnetic member 79 is formed of various material layers, described below in more detail, which are successively deposited over the metal lines 62 and the insulating layer 54, as illustrated in FIG. 14.

Figure 14:
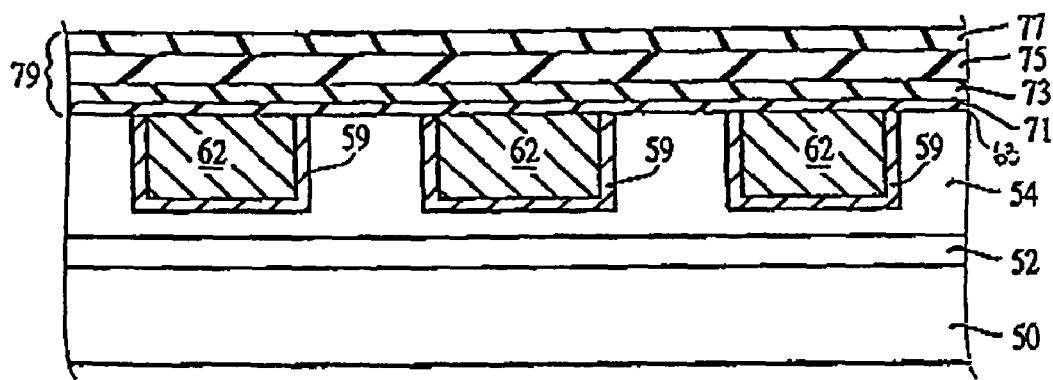
FIG. 14 illustrates a partial cross-sectional view of the MRAM of the present invention at a stage of processing subsequent to that shown in FIG. 13.

In an exemplary embodiment of the present invention and as illustrated in FIG. 14, a first tantalum (Ta) layer 71 (of about 20-400 Angstroms thick, more preferably of about 50 Angstroms thick), a first nickel-iron (NiFe) layer 73 (of about 10-100 Angstroms thick, more preferably of about 60 Angstroms thick), a manganese-iron (MnFe) layer 75 (of about 10-100 Angstroms thick, more preferably of about 100 Angstroms thick) and a second nickel-iron (NiFe) layer 77 (of about 10-100 Angstroms thick, more preferably of about 60 Angstroms thick) are successively blanket deposited over the insulating layer 54 and the metal lines 62, to form the first magnetic member 79. Deposition of the layers 71, 73, 75 and 77 may be accomplished by magnetron sputtering, for example. However, other conventional deposition methods may be used also, as desired.

Figure 15:
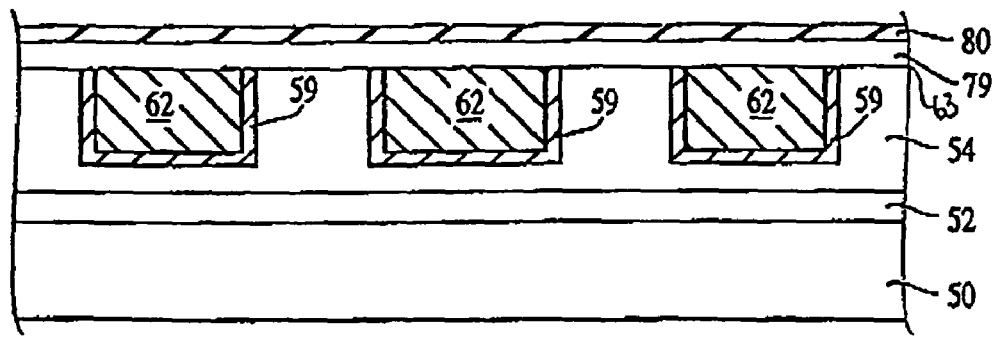
FIG. 15 illustrates a partial cross-sectional view of the MRAM of the present invention at a stage of processing subsequent to that shown in FIG. 14.

Following the deposition of the layers 71, 73, 75 and 77, a nonmagnetic, electrically nonconductive layer 80 formed of, for example, aluminum oxide ($Al_2O_3$) (of about 5-25 Angstroms thick, more preferably of about 15 Angstroms thick) is next formed overlying the first magnetic member 79, as shown in FIG. 15. Although aluminum oxide is the preferred material, it must be understood that the invention is not limited to its use, and other non-magnetic materials, such as copper (Cu), titanium oxide ($TiO_2$), magnesium oxide (MgO), silicon oxide ($SiO_2$) or aluminum nitride (AlN), may be used also.

Figure 16:
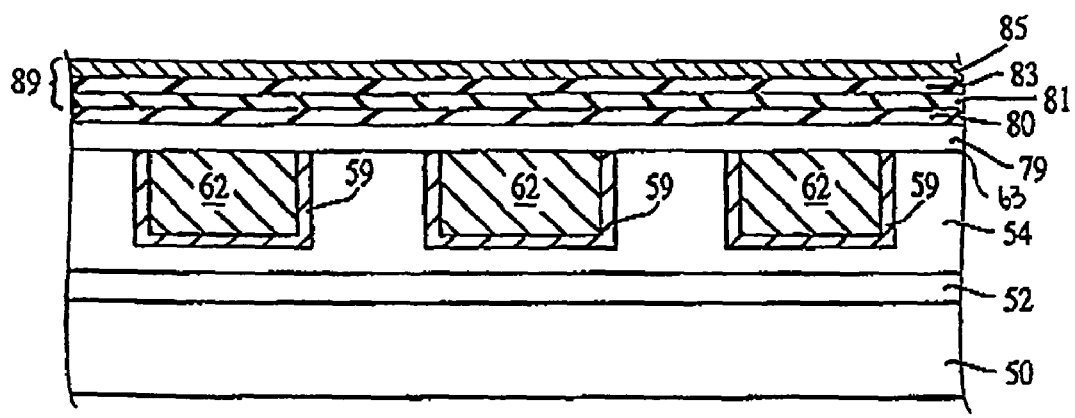
FIG. 16 is a partial three-dimensional view of the MRAM of the present invention at a stage of processing subsequent to that shown in FIG. 15.
Figure 17:
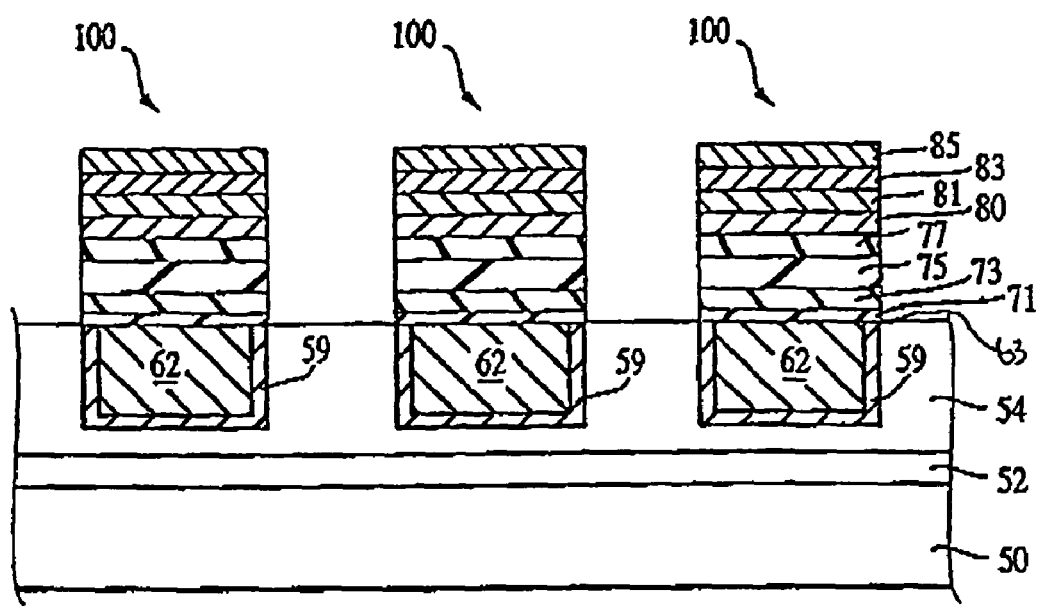
FIG. 17 is a partial three-dimensional view of the MRAM of the present invention at a stage of processing subsequent to that shown in FIG. 16.
Figure 21:
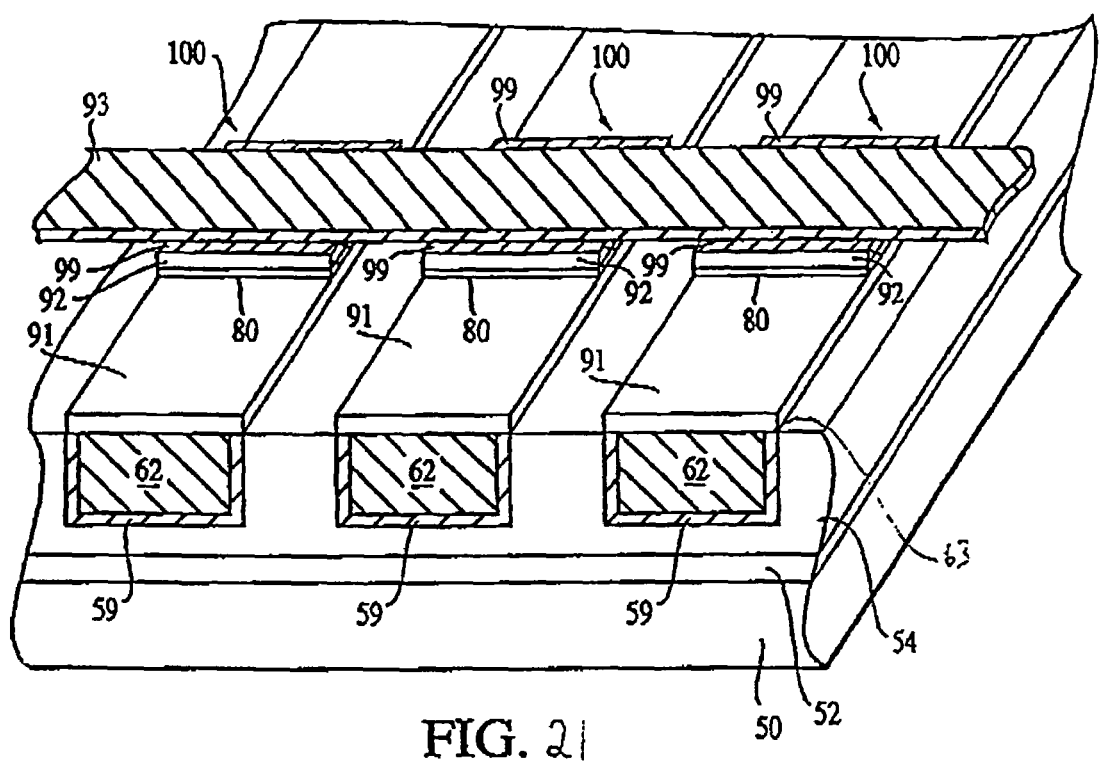
FIG. 21 is a partial three-dimensional view of the MRAM of FIG. 17 at a stage of processing subsequent to that shown in FIG. 20.

Referring now to FIG. 16, a plurality of magnetic multilayer films forming a second magnetic member 89 are next formed over the nonmagnetic layer 80. Accordingly, in an exemplary embodiment of the present invention, a third nickel-iron (NiFe) layer 81 (of about 10-100 Angstroms thick, more preferably of about 40 Angstroms thick), a second tantalum (Ta) layer 83 (of about 10-100 Angstroms thick, more preferably of about 50 Angstroms thick) and a conductive layer 85 (of about 100-400 Angstroms thick, more preferably of about 200-300 Angstroms thick) are successively blanket deposited over the nonmagnetic layer 80, to form the second magnetic member 89, as shown in FIG. 16. Deposition of the layers 81, 83 and 85 may be accomplished by magnetron sputtering, for example, characteristics of the IC devices constructed previously to the formation of the MRAM structures 100 (FIG. 21).

In an exemplary embodiment of the present invention, the conductive layer 85 may be formed of tungsten nitrogen (WN), which is deposited to a thickness of about 100-400 Angstroms, more preferably of about 200-300 Angstroms. However, the invention is not limited to this exemplary embodiment; this layer may be comprised of a resistive material such as WN, TaN, WSiN, and others. This layer may act as a series resistor and or a CMP stopping layer dependent on the material and thickness chosen. Materials such as a-c amorphous carbon, various oxides and nitrides may be used as CMP stops as well as series resistors.

Next, layers 71, 73, 75, 77, 80, 81, 83 and 85 (FIGS. 14-16) are patterned into a plurality of MRAM structures or cells 100 (FIGS. 17-18) including columns of pinned layers 91 and rows of sense layers 92. Thus, each MRAM structure 100 includes the pinned layer 91 (as part of the first magnetic member 79)-separated from a-sense layer 92 (as part of the second magnetic member 89) by the nonmagnetic layer 80. For simplicity, the multilayer stack forming the pinned layer 91 is illustrated in FIG. 16 as a single layer. Similarly, the multilayer stack forming the sense layer 92 is also illustrated in FIG. 18 as a single layer. It must be understood, however, that the pinned layer 91 includes portions of the copper line 62 and of the layers 71, 73, 75 and 77, while the sense layer 92 includes portions of the layers 81, 83 and 85.

Patterning of the plurality of layers forming the pinned and sense layers of the MRAM structures 100 (FIG. 18), that is patterning of layers 71, 73, 75, 77, 80, 81, 83 and 85 may be accomplished by ion milling which typically involves physical sputtering of each layer by an argon ion beam. Patterning may be also accomplished by using a reactive plasma etch, performed, for example, in electron cyclotron resonance (ECR) or other high density plasmas, such as an inductively coupled plasma system, or a helicon plasma system containing chlorine as the source gas. A mixture of chlorine with other gases, such as argon, neon or helium, among others, may be used also. In any event, the pinned and sense layers 91, 92 are patterned and etched so that the pinned layers 91 correspond to the metal lines 62 that form the bottom electrodes of the pinned layers 91.

Figure 19:
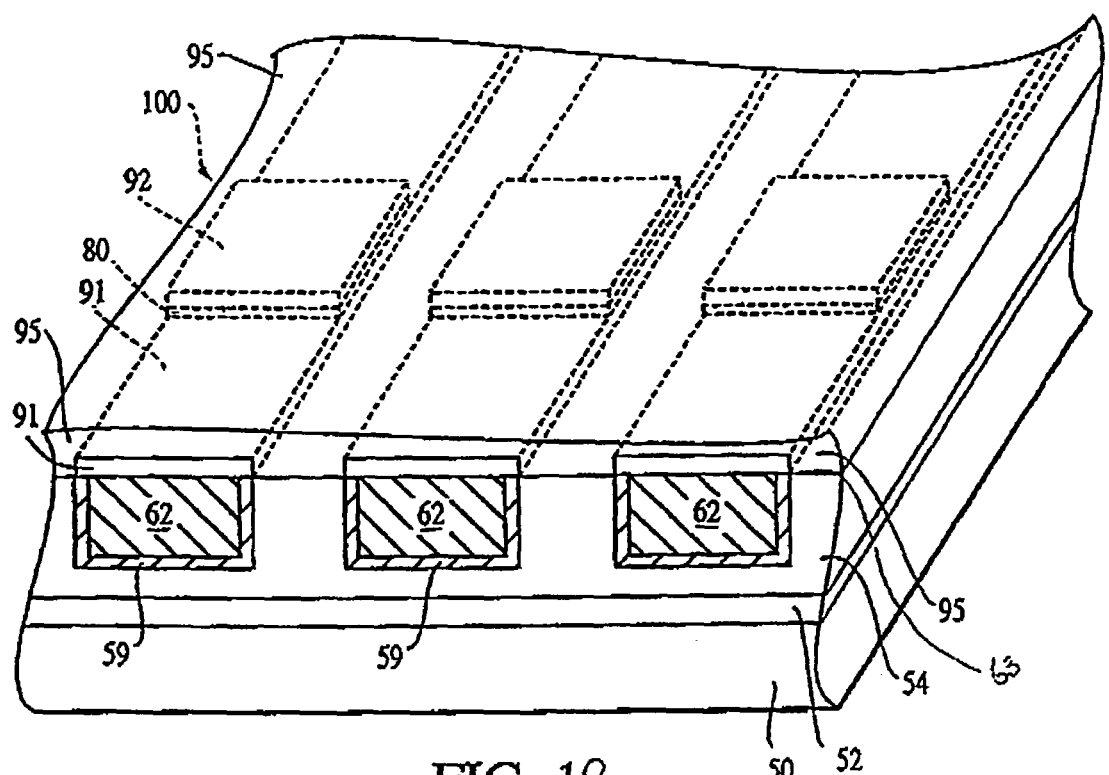
FIG. 19 is a partial three-dimensional view of the MRAM of FIG. 17 at a stage of processing subsequent to that shown in FIG. 18.

Next, an insulating layer 95 (FIG. 19) is formed overlying the substrate 50 including the MRAM structures 100 to a thickness of about 90-10,000 Angstroms, more preferably of about 5,000 Angstroms. The insulating layer 95 completely fills the spaces between any adjacent MRAM structures 100, as shown in FIG. 19. In an exemplary embodiment of the invention, the insulating layer 95 is formed of a nitride material such as silicon nitride ($Si_3N_4$), which may be formed by conventional deposition methods, such as sputtering by chemical vapor deposition (CVD), plasma enhanced CVD (PECVD), or physical vapor deposition (PVD), among others. However, other conventional insulating materials, for example, BPSG, aluminum oxide, a thermal oxide of silicon, such as SiO or $SiO_2$, or a high temperature polymer, such as a polyimide, a low dielectric constant inorganic material, amorphous dielectric, or bias sputtered quartz may also be employed.

Figure 20:
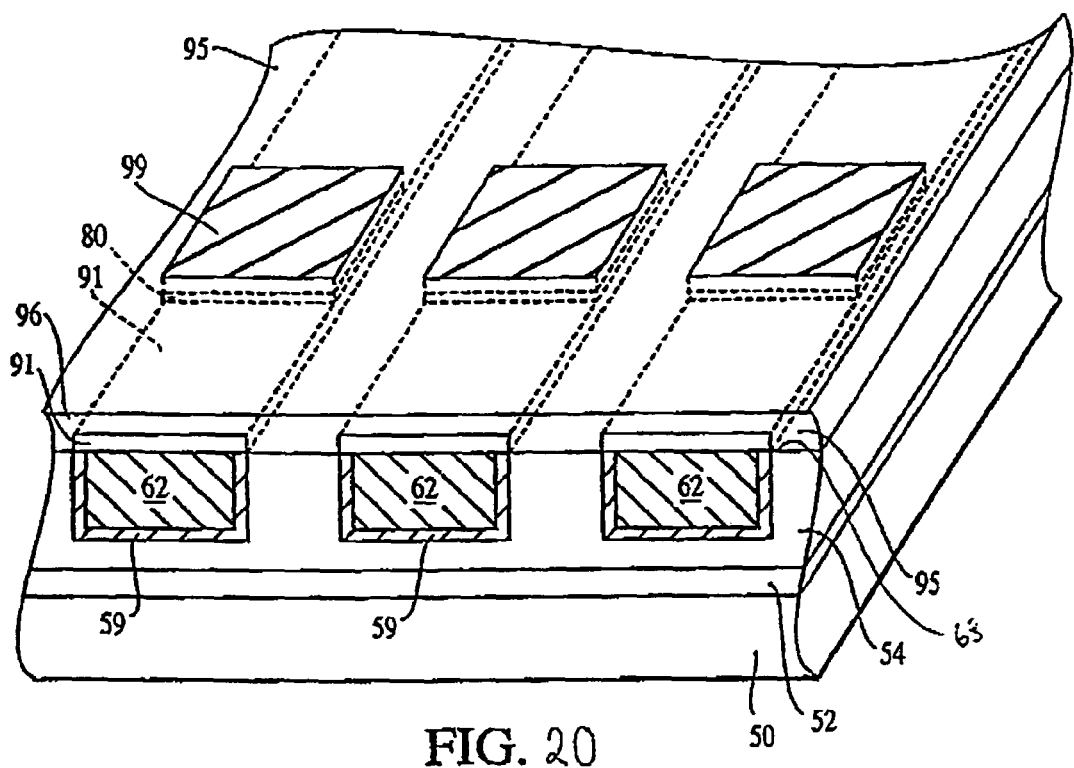
FIG. 20 is a partial three-dimensional view of the MRAM of FIG. 17 at a stage of processing subsequent to that shown in FIG. 19.

Subsequent to the formation of the insulating layer 95 (FIG. 19), portions of the insulating layer 95 that are formed over the top surface of the MRAM structures 100 are removed by means of chemical mechanical polishing (CMP) or well-known RIE dry etching processes. In an exemplary embodiment of the invention, the insulating layer 95 is chemical mechanical polished so that an abrasive polish removes the top surface of the insulating layer 95 above the MRAM structures 100, down to or near the planar surface of the top surface of the conductive layer 85, to form respective MRAM contacts 99 in a polished insulating layer 96, as illustrated in FIG. 20. This way, the conductive layer 85, which was formed as part of the sense layer 92 of the MRAM structure 100, acts as a polishing stop layer in the formation of the contacts 99.

Additional steps to create a functional MRAM cell having a contact may be carried out. For example, FIG. 21 illustrates schematically three MRAM cell structures 100 coupled to a word line 93 that intersects three pinned layers 91 and associated sense layers 92 at respective MRAM contacts 99. As known in the art, the word line 93 may be formed of copper, for example, by patterning a mask on a dielectric layer, which is formed over the sense layers 92 including the MRAM contacts 99, and by forming a trench in which conductive word line 93 is formed on a direction orthogonal to that of the sense layer 92. For a better understanding of the invention, the polished insulating layer 96 has been omitted in FIG. 21 to illustrate the pinned layers and sense layers 91, 92 below the word line 93. However, it must be understood that the space between the pinned layers and sense layers 91, 92 and below the word line 93 is filled with the insulating layer 96.

Although FIG. 21 illustrates MRAM contacts 99 in direct contact and adjacent to the word line 93, it must be understood that the invention is not limited to this embodiment, and other interceding structures, such as conductive plugs and/or metal lines from the MRAM contacts 99 to the word line 93 may be formed also, as desired.

Figure 22:
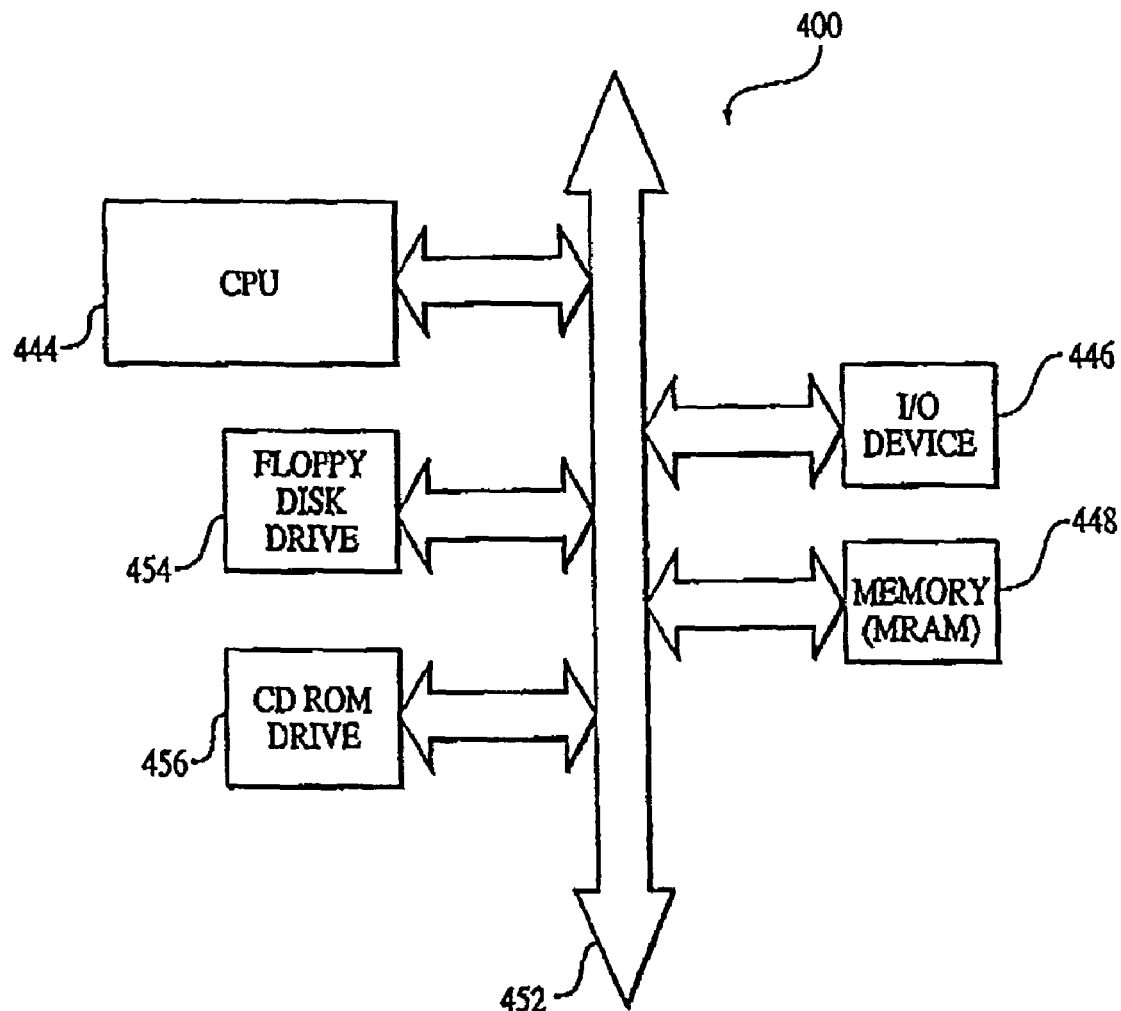
FIG. 22 is a schematic diagram of processor system incorporating the MRAM constructed in accordance with the present invention.

A typical processor based system 400 which includes a memory circuit 448, for example an MRAM with MRAM cell structures 100 having MRAM contacts 99 (FIGS. 20-21) constructed according to the present invention is illustrated in FIG. 22. A processor system, such as a computer system, generally comprises a central processing unit (CPU) 444, such as a microprocessor, a digital signal processor, or other programmable digital logic devices, which communicates with an input/output (I/O) device 446 over a bus 452. The memory 448 communicates with the system over bus 452.

In the case of a computer system, the processor system may include peripheral devices such as a floppy disk drive 454 and a compact disk (CD) ROM drive 456 which also communicate with CPU 444 over the bus 452. Memory 448 may be combined with the processor, i.e. CPU 444, in a single integrated circuit.

Although the exemplary embodiments described above illustrate the formation of three MRAM cell structures 100 having respective MRAM contacts 99 (FIGS. 20-21) it is to be understood that the present invention contemplates the use of a plurality of MRAM contacts 99 of pinned layers and sense layers as part of a plurality of MRAM cells arranged, for example, in rows and columns in a memory cell array. In addition, although the exemplary embodiments described above refer to a specific topography of the MRAM structures with specific magnetic materials forming such structures, it must be understood that the invention is not limited to the above-mentioned magnetic materials, and other magnetic and ferromagnetic materials, such as nickel-iron (Permalloy) or iron, among others, may be used also. Further, although the exemplary embodiments described above refer to patterning of the MRAM structures by reactive plasma etching, it must be understood that the present invention contemplates the use of other methods of patterning and etching.

The present invention is thus not limited to the details of the illustrated embodiment. Accordingly, the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A magnetic random access memory structure comprising:
   an insulating layer having a plurality of grooves formed therein;
   a barrier layer in each of said plurality of grooves;
   longitudinally extending conductive lines formed over said barrier layer in each of said plurality of grooves, said barrier layer and said conductive lines having upper surfaces, wherein said upper surfaces have roughened portions and protruding portions;

a planarized conductive material layer formed over said roughened portions and protruding portions of said upper surfaces of said barrier layer and said conductive lines;

respective first magnetic layers over said planarized conductive material layer; and respective second magnetic layers over said first magnetic layers.

2. The structure of claim 1 wherein said conductive material layer is selected from the group consisting of tantalum (Ta), titanium (Ti), titanium-tungsten (TiW), titanium nitride (TiN) and chromium (Cr).

3. The structure of claim 1 wherein said conductive material layer is a resistive material.

4. The structure of claim 1 wherein said insulating layer is selected from the group consisting of BPSG, SiO, $SiO_2$, $Si_3N_4$ and polyimide.

5. The structure of claim 1 wherein said conductive material layer is formed to a thickness of about 5 nm to about 20 nm.

6. The structure of claim 3 wherein said conductive material layer is a resistive material comprising one of TaN and WSiN.

7. A memory device comprising:

at least one magnetic random access memory cell, said magnetic random access memory cell comprising:

an insulating layer having trenches formed therein;

a barrier layer formed in said trenches in the insulating layer;

a conductor formed over the barrier layer, said barrier layer and conductor having a top surface, wherein said top surface has roughened portions and protruding portions;

a planarized conductive material layer provided over said roughened portions and protruding portions of said top surface of said barrier layer and said conductor;

a first ferromagnetic layer formed over said conductor;

a second ferromagnetic layer formed over said first ferromagnetic layer; and a nonmagnetic layer between said first and second ferromagnetic layers.

8. The device of claim 7 wherein said conductive material layer is selected from the group consisting of tantalum (Ta), titanium (Ti), titanium-tungsten (TiW), titanium nitride (TiN) and chromium (Cr).

9. The device of claim 7 wherein said conductive material layer is a resistive material.

10. The device of claim 7 wherein said insulating layer is selected from the group consisting of BPSG, SiO, $SiO_2$, $Si_3N_4$ or polyimide.

11. The device of claim 7 wherein said conductive material layer is formed to a thickness of about 5 nm to about 20 nm.

12. The device of claim 9 wherein said conductive material layer is a resistive material comprising one of TaN and WSiN.

13. The structure of claim 1, wherein respective first magnetic layers over said conductive lines are also over said barrier layer.

14. The device of claim 7, wherein the first ferromagnetic layer formed over said conductor also is formed over said barrier layer.

* * * * *